(12) United States Patent
Ishii et al.

(10) Patent No.: US 7,071,266 B2
(45) Date of Patent: Jul. 4, 2006

(54) CURABLE RESIN COMPOSITION AND CURED PRODUCT THEREOF

(75) Inventors: Kenji Ishii, Tokyo (JP); Yasumasa Norisue, Tokyo (JP); Daisuke Ohno, Tokyo (JP); Michio Nawata, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 176 days.

(21) Appl. No.: 10/747,237

(22) Filed: Dec. 30, 2003

(65) Prior Publication Data

US 2004/0152848 A1 Aug. 5, 2004

(30) Foreign Application Priority Data

Jan. 17, 2003 (JP) ............................ 2003-009422
Jan. 29, 2003 (JP) ............................ 2003-020150

(51) Int. Cl.
*C08L 71/12* (2006.01)

(52) U.S. Cl. .................. 525/390; 525/534; 525/905; 528/219

(58) Field of Classification Search ............ 525/390, 525/534, 905; 528/219
See application file for complete search history.

(56) References Cited

U.S. PATENT DOCUMENTS

| 4,389,516 | A | * | 6/1983 | Sugio et al. ............. 525/534 |
| 4,983,683 | A | * | 1/1991 | Shimp ..................... 525/390 |
| 6,835,785 | B1 | * | 12/2004 | Ishii et al. ............. 525/391 |
| 2003/0130438 | A1 | | 7/2003 | Amagai et al. |
| 2003/0194562 | A1 | | 10/2003 | Ishii et al. |

FOREIGN PATENT DOCUMENTS

| EP | 0945477 A1 | | 9/1999 |
| JP | 6-207096 A | * | 7/1994 |
| JP | 6-345864 A | * | 12/1994 |
| JP | 2003-138133 A | * | 5/2003 |

* cited by examiner

*Primary Examiner*—Robert Sellers
*Assistant Examiner*—Marc S Zimmer
(74) *Attorney, Agent, or Firm*—Wenderoth, Lind & Ponack, L.L.P.

(57) ABSTRACT

A curable resin composition containing a polyfunctional cyanate ester resin and a bifunctional phenylene ether oligomer having a number average molecular weight of 500 to 3,000 and having a specific structure represented by the formula (1), and a cured product thereof.

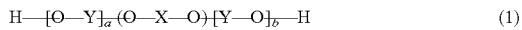

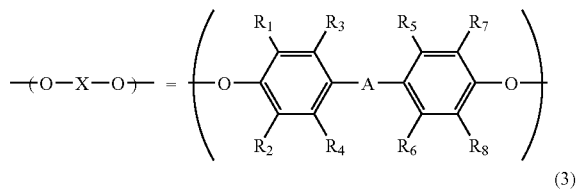

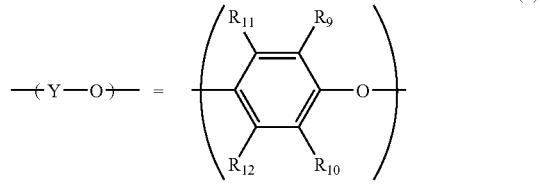

9 Claims, No Drawings

CURABLE RESIN COMPOSITION AND CURED PRODUCT THEREOF

FIELD OF THE INVENTION

The present invention relates to a curable resin composition composed of a combination of a bifunctional phenylene ether oligomer having a specific structure with a polyfunctional cyanate ester resin, and a cured product thereof. A polymer material excellent in heat resistance and low dielectric characteristics can be obtained by curing the curable resin composition of the present invention. The curable resin composition can be widely used for applications such as a semiconductor-sealing material, an electrical insulating material, a resin for a copper-clad laminate, a resist, a sealing resin for electronic parts, a resin for a color filter of a liquid crystal, a coating composition, various coating agents, an adhesive, a material for a buildup laminate and FRP.

PRIOR ARTS OF THE INVENTION

Conventionally, a cyanate resin has been used as a raw material for a functional polymer material. In recent years, as higher performances are required in its application fields, physical properties required as a functional polymer material become severer increasingly. As such physical properties, for example, heat resistance, weather resistance, chemical resistance, low moisture absorptivity, high fracture toughness, low dielectric constant and low dielectric loss tangent are required.

In a printed circuit board field, for example, a substrate material having low dielectric characteristics is desired from a signal fade problem attendant upon an increase in the frequency of a signal. Among thermosetting resins, a cyanate ester resin is excellent in heat resistance and low dielectric characteristics, so that there are proposed, for example, a composition containing a cyanate ester resin and an epoxy resin (JP-B-46-41112), a method using a composition containing bismaleimide, a cyanate ester resin and an epoxy resin (JP-B-52-31279), a method in which a polyfunctional phenol compound and a cyanate ester resin are combined (JP-B-7-47637) and a method in which a monofunctional phenol compound and a cyanate ester resin are combined (U.S. Pat. No. 3,261,061).

However, the method in which the polyfunctional phenol compound and the cyanate ester resin are combined, disclosed in JP-B-7-47637, is insufficient for a high frequency application since the dielectric characteristics in a GHz zone worsen. Further, the combination of the monofunctional phenol and the cyanate ester resin in U.S. Pat. No. 3,261,061 is excellent in high frequency properties, while there is a problem that heat resistance decreases since a crosslinking density decreases because of the use of the monofunctional compound.

SUMMARY OF THE INVENTION

It is an object of the present invention to provide a curable resin composition capable of giving a cured product having excellent heat resistance and having low dielectric constant and low dielectric loss tangent and its cured product.

According to the present invention, there is provided a curable resin composition containing a polyfunctional cyanate ester resin and a bifunctional phenylene ether oligomer having a number average molecular weight of 500 to 3,000 and having a specific structure represented by the formula (1),

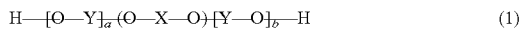

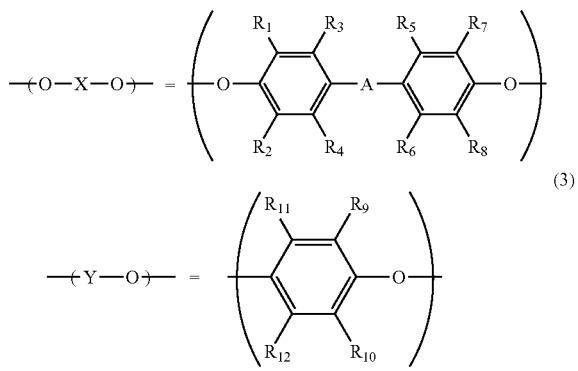

wherein —(O—X—O)— is represented by the formula (2) (in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group, and A is a linear, branched or cyclic hydrocarbon having 20 or less carbon atoms or a direct bond), —(Y—O)— is an arrangement of one kind of structure defined by the formula (3) or a random arrangement of at least two kinds of structures defined by the formula (3) (in which $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group), and each of a and b is an integer of 0 to 30, provided that at least either a or b is not 0.

According to the present invention, further, there is provided a cured product of the above curable resin composition.

DETAILED DESCRIPTION OF THE INVENTION

The present inventors have made diligent studies and as a result found that, when a bifunctional phenylene ether oligomer which has the excellent dielectric characteristics and heat resistance of a polyphenylene ether (to be sometimes referred to as "PPE" hereinafter) structure, has a number average molecular weight of 500 to 3,000 and has a specific structure and a polyfunctional cyanate ester resin are combined and cured, a cured product having excellent heat resistance and low dielectric characteristics can be obtained. On the basis of the above finding, the present inventors have completed the present invention. That is, the present invention relates to a curable resin composition containing a bifunctional phenylene ether oligomer having a specific structure represented by the formula (1) in combination with a polyfunctional cyanate ester resin, and it relates to a cured product obtainable by curing the above composition.

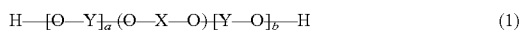

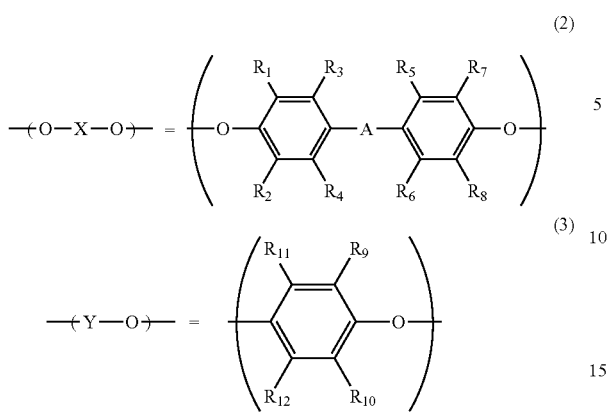

wherein —(O—X—O)— is represented by the formula (2) (in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group, and A is a linear, branched or cyclic hydrocarbon having 20 or less carbon atoms or a direct bond), —(Y—O)— is an arrangement of one kind of structure defined by the formula (3) or a random arrangement of at least two kinds of structures defined by the formula (3) (in which $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group), and each of a and b is an integer of 0 to 30, provided that at least either a or b is not 0.

The present invention will be explained in detail hereinafter. Among compounds represented by the formula (1), when A in the formula (2) is a linear, branched or cyclic hydrocarbon having 20 or less carbon atoms, preferable is a compound in which $R_1$, $R_2$, $R_7$ and $R_8$ are an alkyl group having 3 or less carbon atoms, $R_3$, $R_4$, $R_5$ and $R_6$ are a hydrogen atom or an alkyl group having 3 or less carbon atoms, $R_9$ and $R_{10}$ in the formula (3) are an alkyl group having 3 or less carbon atoms, and $R_{11}$ and $R_{12}$ are a hydrogen atom or an alkyl group having 3 or less carbon atoms. More preferable is a compound in which $R_1$, $R_2$, $R_7$ and $R_8$ are a methyl group and —(Y—O)— of the formula (3) has a structure of an arrangement of the formula (4) or the formula (5) or a random arrangement of the formula (4) and the formula (5),

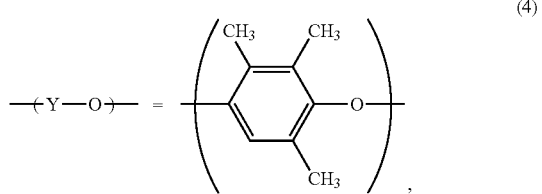

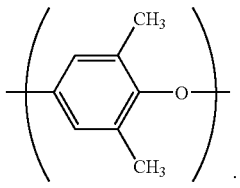

A further preferable compound is a compound in which, in the formula (2), $R_1$, $R_2$, $R_7$ and $R_8$ are a methyl group, $R_3$, $R_4$, $R_5$ and $R_6$ is a hydrogen atom and —(Y—O)— of the formula (3) has a structure of an arrangement of the formula (4) or the formula (5) or a random arrangement of the formula (4) and the formula (5).

When A in the formula (2) is a direct bond, preferable is a compound in which $R_1$, $R_2$, $R_4$, $R_5$, $R_7$ and $R_8$ is an alkyl group having 3 or less carbon atoms, $R_3$ and $R_6$ are a hydrogen group or an alkyl group having 3 or less carbon atoms, $R_9$ and $R_{10}$ in the formula (3) are an alkyl group having 3 or less carbon atoms, and $R_{11}$ and $R_{12}$ is a hydrogen atom or an alkyl group having 3 or less carbon atoms. More preferable is a compound in which $R_1$, $R_2$, $R_4$, $R_5$, $R_7$ and $R_8$ is a methyl group, and —(Y—O)— of the formula (3) has a structure of an arrangement of the formula (4) or the formula (5) or a random arrangement of the formula (4) and the formula (5).

A further preferable compound is a compound in which, in the formula (2), $R_1$, $R_2$, $R_4$, $R_5$, $R_7$ and $R_8$ is a methyl group, $R_3$ and $R_6$ are a hydrogen atom, and —(Y—O)— of the formula (3) has a structure of an arrangement of the formula (4) or the formula (5) or a random arrangement of the formula (4) and the formula (5).

When the molecular weight is too small, the heat resistance and electric characteristics which a phenylene ether structure has can not be obtained. When the molecular weight is too large, the solubility in a general-purpose solvent decreases. The number average molecular weight is preferably 500 to 3,000.

The process for producing the bifunctional phenylene ether oligomer represented by the formula (1) is not specially limited. The above bifunctional phenylene ether oligomer can be produced by any process. For example, the bifunctional phenylene ether oligomer can be produced by oxidatively coupling a bifunctional phenol compound and a monofunctional phenol compound in the presence of copper and an amine according to the method disclosed in JP-A-2003-212990.

A polyfunctional cyanate ester compound (b) used in the present invention is represented by the formula (7), $$R—(O—CN)_m \qquad (7)$$

(wherein m is an integer of from 2 or more to generally 5 or less, R is an organic group having aromaticity, and the above cyanate group directly bonds to an aromatic ring of the above organic group R).

Specific examples of the polyfunctional cyanate ester compound include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, bis(3,5-dimethyl-4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)

phosphate, cyanates obtained by a reaction of a novolak resin with cyanogen halide, and cyanate ester resins having a PPE structure disclosed in JP-A-2003-238676 and JP-A-2003-238677.

Further, prepolymers having a triazine ring formed by the trimerization of cyanate group of these polyfunctional cyanate ester resins may be also used. The above prepolymer is obtained by polymerizing the above polyfunctional cyanate ester monomer in the presence of an acid such as a mineral acid or a Lewis acid, a base such as sodium alcoholate or a tertiary amine, or a salt such as sodium carbonate as a catalyst.

These polyfunctional cyanate ester resins and the polyfunctional cyanate ester resin prepolymers may be used alone or in combination. With regard to the mixing ratio of the bifunctional polyphenylene ether oligomer and the cyanate ester resin, it is preferred to incorporate the bifunctional polyphenylene ether oligomer and the cyanate ester resin such that the molar ratio (B/A) of the mole (A) of hydroxyl group of the bifunctional polyphenylene ether oligomer and the mole (B) of cyanate group of the cyanate ester resin becomes 2 to 100.

The curable resin composition of the present invention may contain a curing accelerator, an epoxy resin, an oxetane resin and a compound having a polymerizable unsaturated group as required.

The curing accelerator for the polyfunctional cyanate ester resin can be selected from known curing accelerators. Examples thereof include organic metal complexes such as zinc octylate, tin octylate, cobalt naphthenate, zinc naphthenate and iron acetylacetonate, metal salts such as aluminum chloride, tin chloride and zinc chloride, and amines such as triethylamine and dimethylbenzylamine. The curing accelerator shall not be limited to these examples. These curing accelerators may be used alone or in combination. The amount of the curing accelerator, based on the total weight of the bifunctional phenylene ether oligomer and the polyfunctional cyanate ester resin, is preferably 0.001 wt % to 5 wt %, more preferably 0.01 wt % to 0.2 wt %.

The epoxy resin can be selected from generally known epoxy resins. Examples thereof include a bisphenol A type epoxy resin, a bisphenol F type epoxy resin, a biphenyl type epoxy resin, a phenol novolak type epoxy resin, a cresol novolak type epoxy resin, a xylene novolak type epoxy resin, triglycidyl isocyanurate, an alicyclic epoxy resin, a dicyclopentadiene novolak type epoxy resin, a biphenyl novolak type epoxy resin and epoxy resins having a PPE structure disclosed in JP-A-2003-155340 and JP-A-2003-212990. These epoxy resins may be used alone or in combination.

The oxetane resin can be selected from generally known oxetane resins. Examples thereof include alkyl oxetanes such as oxetane, 2-methyloxetane, 2,2-dimethyloxetane, 3-methyloxetane and 3,3-dimethyloxetane, 3-methyl-3-methoxymethyloxetane, 2-chloromethyloxetane, 3,3-bis(chlolomethyl)oxetane, OXT-101 (trade name, supplied by TOAGOSEI Co., Ltd.) and OXT-121 (trade name, supplied by TOAGOSEI Co., Ltd.). These oxetane resins may be used alone or in combination.

When the curable resin composition of the present invention contains the epoxy resin and/or the oxetane resin, an epoxy resin curing agent and/or an oxetane resin curing agent may be used. The above epoxy resin curing agent is selected from generally known curing agents. Examples thereof include imidazole derivatives such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole and 2-phenyl-4-methyl-5-hydroxymethylimidazole; amine compounds such as dicyandiamide, benzyldimethylamine and 4-methyl-N,N-dimethylbenzylamine; and phosphine compounds such as phosphonium compounds. The oxetane resin curing agent can be selected from known cationic polymerization initiators. Commercially available examples include SAN-AID SI-60L, SAN-AID SI-80L, SAN-AID SI-100L (supplied by Sanshin Chemical Industry Co., Ltd.), CI-2064 (supplied by Nippon Soda Co., Ltd.), IRGACURE261 (supplied by Ciba Specialty Chemicals), ADEKAOPTMER SP-170, ADEKAOPTMER SP-150, (supplied by Asahi Denka Kogyo K.K.), and CYRACURE UVI-6990 (supplied by Union Carbide Corporation). The cationic polymerization initiators can be used as an epoxy resin curing agent. These curing agents may be used alone or in combination.

The compound having a polymerizable unsaturated group can be selected from generally known compounds having a polymerizable unsaturated group. Examples thereof include vinyl compounds such as ethylene, propylene and styrene, (meth)acrylates of monohydric and polyhydric alcohols such as methyl(meth)acrylate, 2-hydroxyethyl(meth)acrylate, 2-hydroxypropyl(meth)acrylate, polypropylene glycol di(meth)acrylate, trimethylol propane di(meth)acrylate, trimethylol propane tri(meth)acrylate, pentaerythritol tetra(meth)acrylate and dipentaerythritol hexa(meth)acrylate, epoxy (meth)acrylates such as a bisphenol A type epoxy (meth)acrylate, a bisphenol F type epoxy (meth)acrylate and epoxy (meth)acrylates having a PPE structure disclosed in JP-A-2003-183350 and JP-A-2003-238653, (meth)acrylates having a PPE structure disclosed in JP-A-2003-252983 and JP-A-2003-252833, vinyl compounds having a PPE structure disclosed in Japanese Patent Application Nos. 2002-216724 and 2002-224937 and a benzocyclobutene resin. These compounds having an unsaturated group may be used alone or in combination.

When the compound having an unsaturated group is used, a known photopolymerization initiator and/or a thermal-polymerization initiator may be used as required.

Further, when the curable resin composition of the present invention is produced, there may be added a known additive such as a solvent, a glass fiber, an organic base material, an inorganic filler, a color pigment, an antifoamer, a surface conditioner, a flame retardant, an ultraviolet absorber, an antioxidant, a polymerization inhibitor, a flow regulator or a thermoplastic resin, as required. Examples of the inorganic filler include silicas such as natural silica, fused silica and amorphous silica, white carbon, titanium white, aerosil, alumina, talc, natural mica, synthetic mica, kaolin, clay, aluminum hydroxide, barium sulfate, E-glass, A-glass, C-glass, L-glass, D-glass, S-glass, NE glass and M-glass G20. The thus-obtained curable resin composition is suitable for various uses such as semiconductor-sealing material, an electrical insulating material, a resin for a copper-clad laminate, a resist, a sealing resin for electronic parts, a resin for a color filter of a liquid crystal, a coating composition, various coating agents, an adhesive, a material for a buildup laminate and FRP.

The cured product of the present invention can be obtained by curing the curable resin composition of the present invention, obtained by the above method, according to a known curing method such as a curing method using an electron beam, ultraviolet light or heat.

Effect of the Invention

The curable resin composition of the present invention gives a cured product having a high glass transition temperature having a low dielectric constant and a low dielectric loss tangent so that it is remarkably useful as a high-functional polymer material. For example, the curable resin composition of the present invention can be widely used, as a thermally and electrically excellent material, for various applications such as a semiconductor-sealing material, an electrical insulating material, a resin for a copper-clad laminate, a resist, a sealing resin for electronic parts, a resin for a color filter of a liquid crystal, a coating composition, various coating agents, an adhesive, a material for a buildup laminate and FRP.

EXAMPLES

The present invention will be explained more concretely with reference to Examples hereinafter, while the present invention shall not be specially limited to these Examples. Number average molecular weights and weight average molecular weights were measured according to the gel permeation chromatography (GPC) method.

(Synthesis of Bifunctional Phenylene Ether Oligomer)

Synthesis Example 1

A longitudinally long reactor having a volume of 12 liters and equipped with a stirrer, a thermometer, an air-introducing tube and baffleplates was charged with 2.77 g (12.5 mmol) of $CuBr_2$, 0.54 g (3.1 mmol) of N,N'-di-t-butylethylenediamine, 20.03 g (198.3 mmol) of n-butyldimethylamine and 2,600 g of toluene. The components were stirred at a reaction temperature of 40° C. A mixed solution (molar ratio of a bivalent phenol of the formula (2):a monovalent phenol of the formula (3)=1:3) was obtained by dissolving 129.32 g (0.48 mol) of 2,2',3,3',5,5'-hexamethyl-(1,1'-biphenyl)-4,4'-diol (to be referred to as "HMBP" hereinafter), 175.31 g (1.44 mol) of 2,6-dimethylphenol, 0.36 g (2.1 mmol) of N,N'-di-t-butylethylenediamine and 7.79 g (77.1 mmol) of n-butyldimethylamine in 2,300 g of methanol. The obtained mixed solution was dropwise added to the mixture in the reactor over 230 minutes while carrying out bubbling with 5.2 L/min of a mixed gas of nitrogen and air which gas had an oxygen concentration of 8%, and stirring was carried out. After the completion of the addition, 1,500 g of water in which 14.20 g (37.4 mmol) of tetrasodium ethylenediamine tetraacetate was dissolved was added to the stirred mixture to terminate the reaction. An aqueous layer and an organic layer were separated. Then, the organic layer was washed with 1.0N hydrochloric acid aqueous solution and then washed with pure water. The thus-obtained solution was concentrated by an evaporator and then dried under a reduced pressure, to obtain 295.6 g of an oligomer a. The oligomer a had a number average molecular weight of 650, a weight average molecular weight of 1,040 and a hydroxyl group equivalent of 325.

Synthesis Example 2

A longitudinally long reactor having a volume of 12 liters and equipped with a stirrer, a thermometer, an air-introducing tube and baffleplates was charged with 6.64 g (29.9 mmol) of $CuBr_2$, 1.29 g (7.5 mmol) of N,N'-di-t-butylethylenediamine, 48.07 g (475.9 mmol) of n-butyldimethylamine and 2,600 g of toluene. The components were stirred at a reaction temperature of 40° C. A mixed solution (molar ratio of a bivalent phenol of the formula (2): a monovalent phenol of the formula (3)=1:10) was obtained by dissolving 129.32 g (0.48 mol) of HMBP, 584.38 g (4.79 mol) of 2,6-dimethylphenol, 0.87 g (5.1 mmol) of N,N'-di-t-butylethylenediamine and 18.69 g (185.1 mmol) of n-butyldimethylamine in 2,300 g of methanol. The obtained mixed solution was dropwise added to the mixture in the reactor over 230 minutes while carrying out bubbling with 5.2 L/min of a mixed gas of nitrogen and air which gas had an oxygen concentration of 8%, and stirring was carried out. After the completion of the addition, 1,500 g of water in which 34.09 g (89.7 mmol) of tetrasodium ethylenediamine tetraacetate was dissolved was added to the stirred mixture to terminate the reaction. An aqueous layer and an organic layer were separated. Then, the organic layer was washed with 1.0N hydrochloric acid aqueous solution and then washed with pure water. The thus-obtained solution was concentrated by an evaporator and then dried under a reduced pressure, to obtain 702.2 g of an oligomer b. The oligomer b had a number average molecular weight of 1,490, a weight average molecular weight of 2,320 and a hydroxyl group equivalent of 750.

Synthesis Example 3

A longitudinally long reactor having a volume of 12 liters and equipped with a stirrer, a thermometer, an air-introducing tube and baffleplates was charged with 9.36 g (42.1 mmol) of $CuBr_2$, 1.81 g (10.5 mmol) of N,N'-di-t-butylethylenediamine, 67.77 g (671.0 mmol) of n-butyldimethylamine and 2,600 g of toluene. The components were stirred at a reaction temperature of 40° C. A mixed solution (molar ratio of a bivalent phenol of the formula (2): a monovalent phenol of the formula (3)=1:15) was obtained by dissolving 129.32 g (0.48 mol) of HMBP, 878.4 g (7.2 mol) of 2,6-dimethylphenol, 1.22 g (7.2 mmol) of N,N'-di-t-butylethylenediamine and 26.35 g (260.9 mmol) of n-butyldimethylamine in 2,300 g of methanol. The obtained mixed solution was dropwise added to the mixture in the reactor over 230 minutes while carrying out bubbling with 5.2 L/min of a mixed gas of nitrogen and air which gas had an oxygen concentration of 8%, and stirring was carried out. After the completion of the addition, 1,500 g of water in which 48.06 g (126.4 mmol) of tetrasodium ethylenediamine tetraacetate was dissolved was added to the stirred mixture to terminate the reaction. An aqueous layer and an organic layer were separated. Then, the organic layer was washed with 1.0N hydrochloric acid aqueous solution and then washed with pure water. The thus-obtained solution was concentrated by an evaporator and then dried under a reduced pressure, to obtain 990.1 g of an oligomer c. The oligomer c had a number average molecular weight of 1,975, a weight average molecular weight of 3,514 and a hydroxyl group equivalent of 990.

Examples 1 to 5

Each of the oligomer a, the oligomer b and the oligomer c was respectively mixed with a cyanate ester resin and a curing accelerator as shown in Table 1, the mixture was stirred at 150° C. for 10 minutes to melt it, and the molten mixture was degassed and molded and then cured at 230° C. for 10 hours, whereby cured products were obtained.

Comparative Examples 1 and 2

A cyanate ester resin and a curing accelerator were mixed as shown in Table 1 and the mixture was stirred at 130° C. for 10 minutes to melt it, and the molten mixture was degassed and molded and then cured at 230° C. for 10 hours, whereby cured products were obtained.

TABLE 1

|  | Ex. 1 | Ex. 2 | Ex. 3 | Ex. 4 | Ex. 5 | CEx. 1 | CEx. 2 |
|---|---|---|---|---|---|---|---|
| Oligomer a | 15 | 30 | 30 | — | — | — | — |
| Oligomer b | — | — | — | 30 | — | — | — |
| Oligomer c | — | — | — | — | 30 | — | — |
| Cyanate ester resin | | | | | | | |
| Arocy B-10 | 85 | 70 | — | 70 | 70 | 100 | — |
| Arocy M-10 | — | — | 70 | — | — | — | 100 |
| Zinc naphthenate | 0.1 | 0.02 | 0.05 | 0.02 | 0.02 | 0.2 | 0.5 |

Ex. = Example,
CEx. = Comparative Example
Arocy B-10: 2,2-bis(4-cyanatophenyl)propane
Arocy M-10: bis(3,5-dimethyl-4-cyanatophenyl)methane Table 2 shows evaluation results of physical properties of the above cured products.

TABLE 2

|  | Ex. 1 | Ex. 2 | Ex. 3 | Ex. 4 | Ex. 5 | CEx. 1 | CEx. 2 |
|---|---|---|---|---|---|---|---|
| Tg (° C.) | 281 | 275 | 277 | 274 | 270 | 304 | 303 |
| Dielectric constant (1 GHz) | 2.76 | 2.75 | 2.60 | 2.73 | 2.73 | 2.85 | 2.71 |
| Dielectric loss tangent (1 GHz) | 0.006 | 0.006 | 0.005 | 0.006 | 0.005 | 0.011 | 0.010 |

Ex. = Example,
CEx. = Comparative Example (Synthesis of Bifunctional Phenylene Ether Oligomer)

Synthesis Example 4

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C. A solution of 45.4 g (0.16 mol) of 4,4'-(1-methylethylidene)bis(2,6-dimethylphenol) as a bivalent phenol and 58.6 g (0.48 mol) of 2,6-dimethylphenol in 800 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 98.8 g of an oligomer d represented by the formula (1). The oligomer d had a number average molecular weight of 845, a weight average molecular weight of 1,106 and a hydroxyl group equivalent of 451.

Synthesis Example 5

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C. A solution of 51.8 g (0.16 mol) of 4,4'-cyclohexylidenebis(2,6-dimethylphenol) as a bivalent phenol and 58.6 g (0.48 mol) of 2,6-dimethylphenol in 800 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 102.6 g of an oligomer e represented by the formula (1). The oligomer e had a number average molecular weight of 877, a weight average molecular weight of 1,183 and a hydroxyl group equivalent of 477.

Synthesis Example 6

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C. A solution of 45.4 g (0.16 mol) of 4,4'-methylidenebis(2,3,6-trimethylphenol) as a bivalent phenol and 58.6 g (0.48 mol) of 2,6-dimethylphenol in 800 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 97.4 g of an oligomer f represented by the formula (1). The oligomer f had a number average molecular weight of 852, a weight average molecular weight of 1,133 and a hydroxyl group equivalent of 460.

Synthesis Example 7

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C. A solution of 68.8 g (0.16 mol) of 4,4'-[1,4-phenylenebis(1-methylethylidene)]bis(2,3,6-trimethylphenol) as a bivalent phenol and 58.6 g (0.48 mol) of 2,6-dimethylphenol in 800 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 114.6 g of an oligomer g represented by the formula (1). The oligomer g had a number average molecular weight of 934, a weight average molecular weight of 1,223 and a hydroxyl group equivalent of 496.

Synthesis Example 8

A longitudinally long reactor having a volume of 2 liters and equipped with a stirrer, a thermometer, an air-introducing tube and baffleplates was charged with 1.3 g (0.012 mol) of CuCl, 70.7 g (0.55 mol) of di-n-butylamine and 400 g of methyl ethyl ketone. The components were stirred at a reaction temperature of 40° C. A solution of 41.0 g (0.16 mol) of 4,4'-methylenebis(2,6-dimethylphenol) as a bivalent phenol and 58.6 g (0.48 mol) of 2,6-dimethylphenol in 800 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 94.6 g of an oligomer h represented by the formula (1). The oligomer h had a number average molecular weight of 801, a weight average molecular weight of 1,081 and a hydroxyl group equivalent of 455.

Synthesis Example 9

A longitudinally long reactor having a volume of 5 liters and equipped with a stirrer, a thermometer, an air-introducing tube and baffleplates was charged with 2.8 g (0.028 mol) of CuCl, 169.7 g (1.32 mol) of di-n-butylamine and 1,000 g of methyl ethyl ketone. The components were stirred at a reaction temperature of 40° C. A solution of 41.0 g (0.16 mol) of 4,4'-methylenebis(2,6-dimethylphenol) as a bivalent phenol and 195.3 g (1.6 mol) of 2,6-dimethylphenol in 1,900 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 212.5 g of an oligomer i represented by the formula (1). The oligomer i had a number average molecular weight of 1,613, a weight average molecular weight of 2,420 and a hydroxyl group equivalent of 834.

Synthesis Example 10

A longitudinally long reactor having a volume of 5 liters and equipped with a stirrer, a thermometer, an air-introducing tube and baffleplates was charged with 3.9 g (0.039 mol) of CuCl, 237.5 g (1.84 mol) of di-n-butylamine and 1,300 g of methyl ethyl ketone. The components were stirred at a reaction temperature of 40° C. A solution of 41.0 g (0.16 mol) of 4,4'-methylenebis(2,6-dimethylphenol) as a bivalent phenol and 292.9 g (2.4 mol) of 2,6-dimethylphenol in 1,700 g of methyl ethyl ketone was dropwise added to the mixture in the reactor over 120 minutes while carrying out bubbling with 2 L/min of air. After the completion of the addition, stirring was carried out for 60 minutes with continuing the bubbling with 2 L/min of air. A disodium dihydrogen ethylenediamine tetraacetate aqueous solution was added to the stirred mixture to terminate the reaction. Then, an organic layer was washed with 1N hydrochloric acid aqueous solution and then washed with pure water. The thus-obtained solution was concentrated by an evaporator and then dried under a reduced pressure, to obtain 305 g of an oligomer j represented by the formula (1). The oligomer j had a number average molecular weight of 2,150, a weight average molecular weight of 3,256 and a hydroxyl group equivalent of 1,093.

Examples 6 to 14

Each of the oligomers d to j obtained in Synthesis Examples 4 to 10 was respectively mixed with a cyanate ester resin and a curing accelerator, as shown in Table 3, the mixture was stirred at 150° C. for 10 minutes to melt it, and the molten mixture was degassed and molded and then cured at 230° C. for 10 hours, whereby cured products were obtained.

Comparative Examples 3 and 4

A cyanate ester resin and a curing accelerator were mixed as shown in Table 3 and the mixture was stirred at 130° C. for 10 minutes to melt it, and the molten mixture was degassed and molded and then cured at 230° C. for 10 hours, whereby cured products were obtained.

TABLE 3

|  | Ex. 6 | Ex. 7 | Ex. 8 | Ex. 9 | Ex. 10 |
|---|---|---|---|---|---|
| Oligomer d | 15 | 30 | 30 | — | — |
| Oligomer e | — | — | — | 30 | — |
| Oligomer f | — | — | — | — | 30 |
| Oligomer g | — | — | — | — | — |
| Oligomer h | — | — | — | — | — |
| Oligomer i | — | — | — | — | — |
| Oligomer j | — | — | — | — | — |
| Cyanate ester resin |  |  |  |  |  |
| Arocy B-10 | 85 | 70 | — | 70 | 70 |
| Arocy M-10 | — | — | 70 | — | — |
| Zinc naphthenate | 0.1 | 0.02 | 0.05 | 0.02 | 0.02 |

|  | Ex. 11 | Ex. 12 | Ex. 13 | Ex. 14 | CEx. 3 | CEx. 4 |
|---|---|---|---|---|---|---|
| Oligomer d | — | — | — | — | — | — |
| Oligomer e | — | — | — | — | — | — |
| Oligomer f | — | — | — | — | — | — |
| Oligomer g | 30 | — | — | — | — | — |
| Oligomer h | — | 30 | — | — | — | — |
| Oligomer i | — | — | 30 | — | — | — |
| Oligomer j | — | — | — | 30 | — | — |
| Cyanate ester resin |  |  |  |  |  |  |
| Arocy B-10 | 70 | 70 | 70 | 70 | 100 | — |
| Arocy M-10 | — | — | — | — | — | 100 |
| Zinc naphthenate | 0.02 | 0.02 | 0.02 | 0.02 | 0.2 | 0.5 |

Ex. = Example,
CEx. = Comparative Example
Arocy B-10: 2,2-bis(4-cyanatophenyl)propane
Arocy M-10: bis(3,5-dimethyl-4-cyanatophenyl)methane The cured products obtained in Examples 6 to 14 and Comparative Examples 3 and 4 were evaluated for properties by the following methods.

Glass transition temperature (Tg): Obtained according to a dynamic viscoelasticity measurement (DMA). The measurement was carried out at an oscillation frequency of 10 Hz.

Dielectric constant and dielectric loss tangent: Obtained according to a cavity resonant oscillation method.

Table 4 shows evaluation results of the above physical properties.

TABLE 4

|  | Ex. 6 | Ex. 7 | Ex. 8 | Ex. 9 | Ex. 10 |
|---|---|---|---|---|---|
| Tg (° C.) | 281 | 273 | 274 | 270 | 270 |
| Dielectric constant (1 GHz) | 2.76 | 2.75 | 2.61 | 2.73 | 2.72 |
| Dielectric loss tangent (1 GHz) | 0.007 | 0.006 | 0.005 | 0.006 | 0.005 |

|  | Ex. 11 | Ex. 12 | Ex. 13 | Ex. 14 | CEx. 3 | CEx. 4 |
|---|---|---|---|---|---|---|
| Tg (° C.) | 266 | 265 | 263 | 268 | 304 | 303 |
| Dielectric constant (1 GHz) | 2.73 | 2.71 | 2.71 | 2.70 | 2.85 | 2.71 |
| Dielectric loss tangent (1 GHz) | 0.006 | 0.005 | 0.005 | 0.006 | 0.011 | 0.010 |

Ex. = Example,
CEx. = Comparative Example

What is claimed is:

1. A curable resin composition containing a polyfunctional cyanate ester resin and a bifunctional phenylene ether oligomer having a number average molecular weight of 500 to 3,000 and having a specific structure represented by the formula (1),

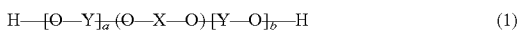

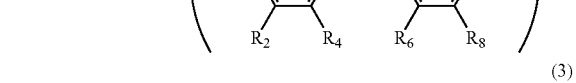

wherein —(O—X—O)— is represented by the formula (2) (in which $R_1$, $R_2$, $R_7$ and $R_8$ may be the same or different and are a halogen atom, an alkyl group having 6 or less carbon atoms or a phenyl group, $R_3$, $R_4$, $R_5$ and $R_6$ may be the same or different and are a hydrogen atom, a halogen atom, an alkyl group having 6 or less carbon atoms or a phenyl group, and A is a linear, branched or cyclic hydrocarbon having 20 or less carbon atoms or a direct bond), —(Y—O)— is an arrangement of one kind of structure defined by the formula (3) or a random arrangement of at least two kinds of structures defined by the formula (3) (in which $R_9$ and $R_{10}$ may be the same or different and are a halogen atom, an alkyl group having 6 or less carbon atoms or a phenyl group and $R_{11}$ and $R_{12}$ may be the same or different and are a hydrogen atom, a halogen atom, an alkyl group having 6 or less carbon atoms or a phenyl group), and each of a and b is an integer of 0 to 30, provided that at least either a or b is not 0.

2. The curable resin composition according to claim 1, wherein A in —(O—X—O)— of the formula (2) is a direct bond, $R_1$, $R_2$, $R_4$, $R_5$, $R_7$ and $R_8$ in —(O—X—O)— of the formula (2) are a methyl group and —(Y—O)— has a structure of an arrangement of the formula (4) or the formula (5) or a random arrangement of the formula (4) and the formula (5),

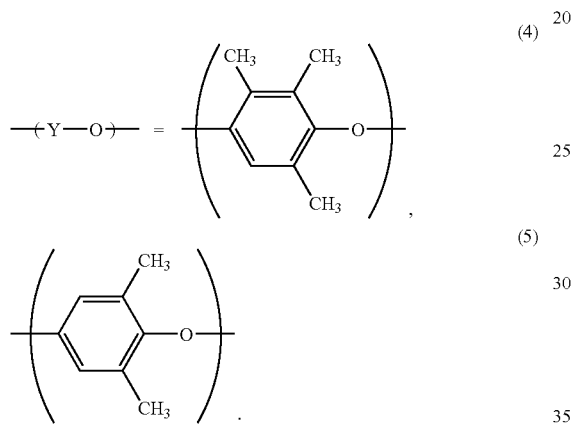

3. The curable resin composition according to claim 2, wherein $R_3$ and $R_6$ are a hydrogen atom.

4. The curable resin composition according to claim 2, wherein —(Y—O)— has a structure represented by the formula (5).

5. The curable resin composition according to claim 1, wherein A in —(O—X—O)— of the formula (2) is a linear, branched or cyclic hydrocarbon having 20 or less carbon atoms, $R_1$, $R_2$, $R_7$ and $R_8$ in —(O—X—O)— of the formula (2) are a methyl group, and —(Y—O)— has a structure of an arrangement of the formula (4) or the formula (5) or a random arrangement of the formula (4) and the formula (5),

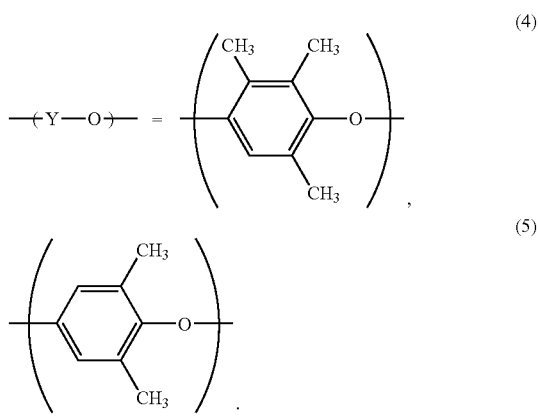

6. The curable resin composition according to claim 5, wherein $R_3$, $R_4$, $R_5$ and $R_6$ are a hydrogen atom.

7. The curable resin composition according to claim 5, wherein —(Y—O)— has a structure represented by the formula (5).

8. The curable resin composition according to claim 1, wherein the molar ratio of a cyanate group in the polyfunctional cyanate ester resin to a hydroxyl group in the bifunctional phenylene ether oligomer is 2–100.

9. A cured product obtainable by curing the curable resin composition recited in claim 1.

* * * * *